United States Patent
Nemeth et al.

(10) Patent No.: US 9,911,873 B2
(45) Date of Patent: Mar. 6, 2018

(54) HYDROGENATION OF PASSIVATED CONTACTS

(71) Applicant: Alliance for Sustainable Energy, LLC, Golden, CO (US)

(72) Inventors: William Nemeth, Wheat Ridge, CO (US); Hao-Chih Yuan, Vancouver, WA (US); Vincenzo LaSalvia, Golden, CO (US); Pauls Stradins, Golden, CO (US); Matthew R. Page, Littleton, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 15/234,586

(22) Filed: Aug. 11, 2016

(65) Prior Publication Data

US 2017/0047458 A1 Feb. 16, 2017

Related U.S. Application Data

(60) Provisional application No. 62/203,799, filed on Aug. 11, 2015.

(51) Int. Cl.

| H01L 31/0224 | (2006.01) |
|---|---|
| H01L 31/0216 | (2014.01) |
| H01L 31/068 | (2012.01) |
| H01L 31/18 | (2006.01) |

(52) U.S. Cl.
CPC ............ *H01L 31/022425* (2013.01); *H01L 31/02167* (2013.01); *H01L 31/068* (2013.01); *H01L 31/1872* (2013.01); *Y02E 10/547* (2013.01); *Y02P 70/521* (2015.11)

(58) Field of Classification Search
CPC ......... H01L 31/022425; H01L 31/1872; H01L 31/068; H01L 31/02167; H01L 31/182
See application file for complete search history.

(56) References Cited

U.S. PATENT DOCUMENTS

| 2014/0299187 A1* | 10/2014 | Chang ................. H01L 31/0747 136/258 |
| 2015/0090323 A1* | 4/2015 | Kim .................. H01L 31/03529 136/255 |
| 2015/0179837 A1* | 6/2015 | Cheong ................. H01L 31/068 136/255 |
| 2017/0025561 A1* | 1/2017 | Kohata ............. H01L 31/02242 |

OTHER PUBLICATIONS

Hoex, B. et al., "Crystalline Silicon Surface Passivation by the Negative-Charge-Dielectric Al₂O₃", Photovoltaics Conference (IEEE), 4 pages; 2008.
(Continued)

*Primary Examiner* — Selim Ahmed
(74) *Attorney, Agent, or Firm* — Robert G. Pittelkow

(57) ABSTRACT

Methods of hydrogenation of passivated contacts using materials having hydrogen impurities are provided. An example method includes applying, to a passivated contact, a layer of a material, the material containing hydrogen impurities. The method further includes subsequently annealing the material and subsequently removing the material from the passivated contact.

17 Claims, 11 Drawing Sheets

(56) References Cited

OTHER PUBLICATIONS

Dingemans, G. et al., "Hydrogen induced passivation of Si interfaces by $Al_2O_3$ films and $SiO_2/Al_2O_3$ stacks", Applied Physics Letters, vol. 97, pp. 152106-1 through 152106-3, 2010.

Dingemans, G. et al., "Influence of annealing and $Al_2O_3$ properties on the hydrogen-induced passivation of the $Si/SiO_2$ interface", Journal of Applied Physics, vol. 111, Issue 9, pp. 093713-1 through 093713-9, 2012.

Hoex, B. et al., "Surface passivation of phosphorus-diffused n+-type emitters by plasma-assisted atomic-layer deposited $Al_2O_3$", Physica Status Solidi, Rapid Research Letters, vol. 6, No. 1, pp. 4-6, 2012.

Richter, A. et al., "Boron Emitter Passivation With $Al_2O_3$ and $Al_2O_3/SiN_x$ Stacks Using ALD $Al_2O_3$", IEEE Journal of Photovoltaics, vol. 3, No. 1, pp. 236-245, 2013.

Stradins, P. et al., "Passivated Tunneling Contacts to N-Type Wafer Silicon and Their Implementation into High Performance Solar Cells", presented at WCPEC-6: 6th World Conference on Photovoltaic Energy Conversion, Kyoto, Japan, pp. 1-4, 2014.

Nemeth, B. et al., "Polycrystalline silicon passivated tunneling contacts for high efficiency silicon solar cells", Journal of Materials Research, vol. 3, Issue 6, pp. 671-681, 2016.

Schmidt, J., "Atomic-Layer-Deposited Aluminum Oxide for the Surface Passivation of High-Efficiency Silicon Solar Cells", Journal of Photovoltaics, Photovoltaic Specialist Conference, pp. 1-5, 2008.

\* cited by examiner

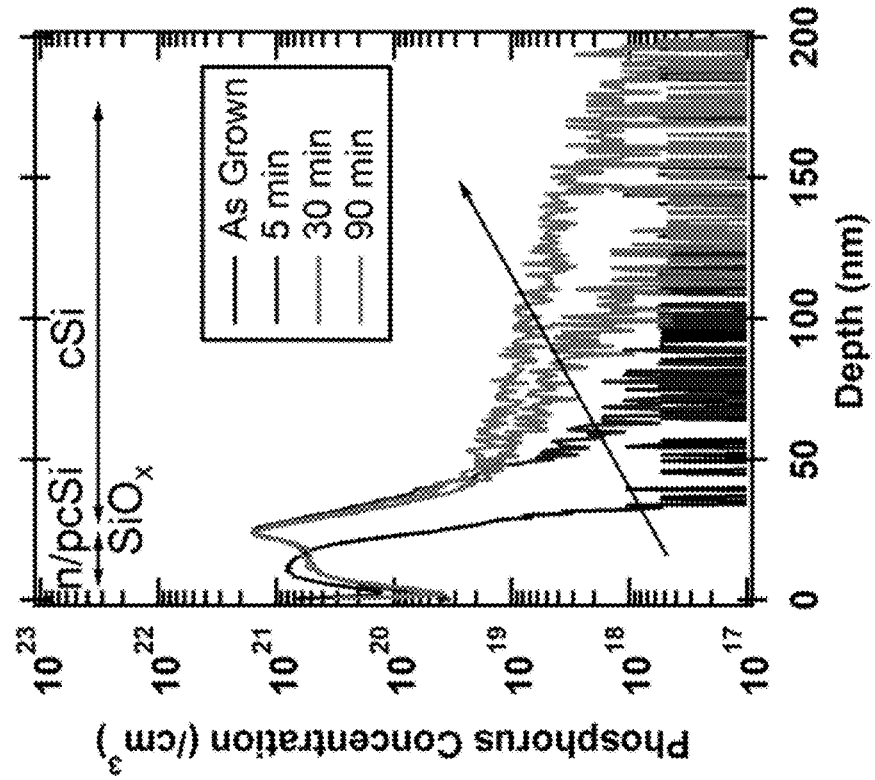
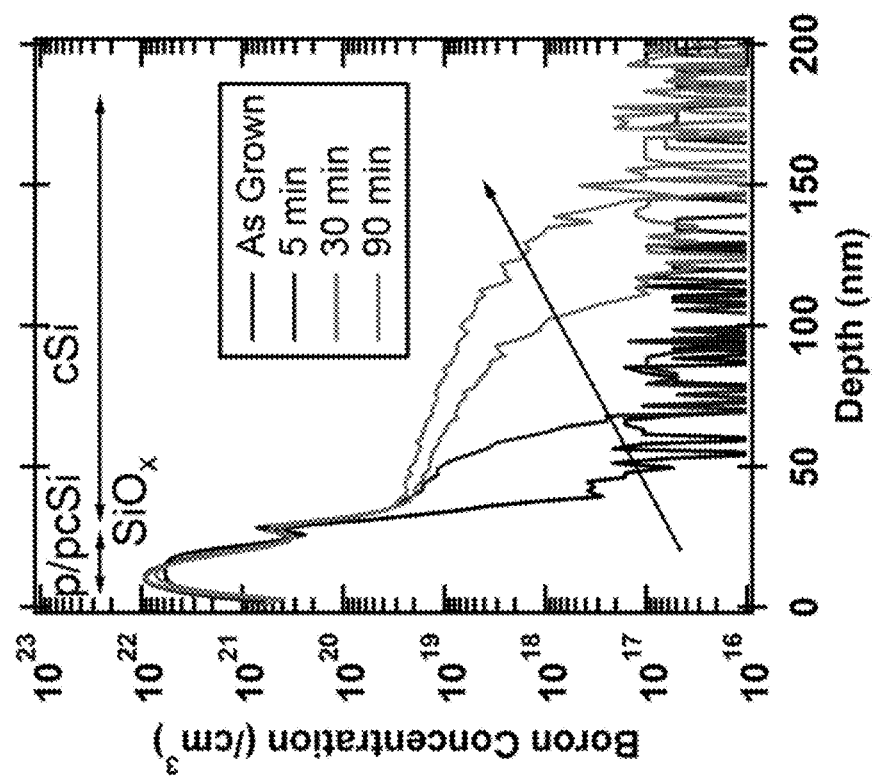
FIG. 3A
FIG. 3B

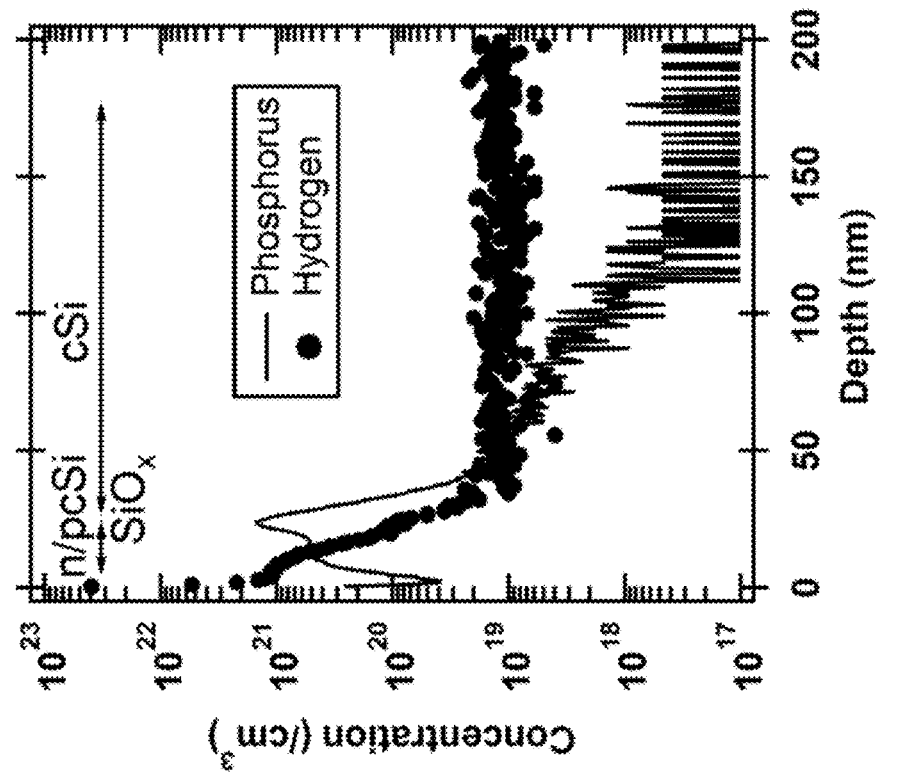
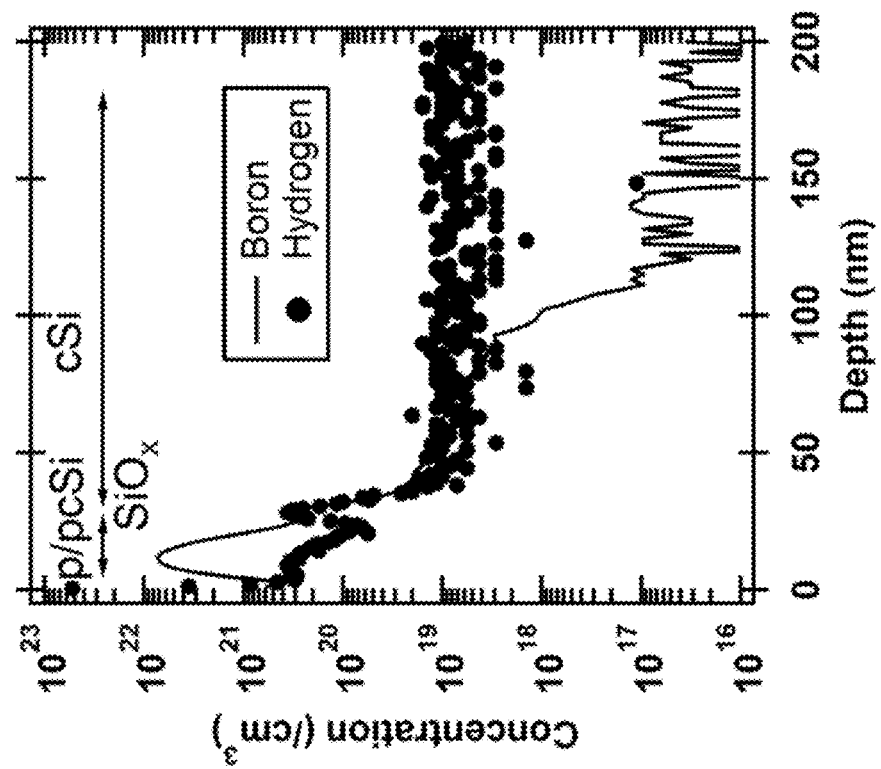
FIG. 5B
FIG. 5A

HYDROGENATION OF PASSIVATED CONTACTS

CROSS-REFERENCE TO RELATED APPLICATIONS

This application claims the benefit of U.S. Provisional Patent Application No. 62/203,799, filed Aug. 11, 2015, the entire content of which is incorporated herein by reference.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Doped polycrystalline silicon (pcSi) films have been used in various silicon (Si) electronic devices as interlayers between active device layers and metal contacts, and contribute to high gain in bipolar junction transistors by lowering the base current and the emitter resistance. In these structures, the presence of an intermediate, tunneling thickness (e.g., <10 nm), silicon oxide ($SiO_x$) layer between the pcSi and the single crystal silicon wafer provides wafer surface passivation without the degradation of transport. Shallow emitters are formed by diffusing dopants from the pcSi through the $SiO_x$ into the wafer via post-deposition anneals. This may be carefully optimized to avoid possible detrimental side effects, such as oxide break-up, secondary phase formation, and blistering. Additionally, dopants tend to segregate along grain boundaries and pile-up at the pcSi/$SiO_x$ interface. This has been shown to increase passivation by lowering carrier mobility along grain boundaries in the pcSi, and to chemically bond to dangling bonds in the $SiO_x$.

When stacks made of doped pcSi formed on $SiO_x$ are used in solar cells, the $SiO_x$ interlayer may provide surface passivation of the underlying wafer. Furthermore, current from the doped pcSi layer may pass through the $SiO_x$ layer (e.g., via leakage/tunneling), thereby enabling low contact resistance. Since the heavily doped pcSi is separated from the wafer by the $SiO_x$, there may be no need for additional surface passivation (as in related art Si cells, e.g. by silicon nitride ($SiN_x$)), and the metal contacts can be applied directly to the pcSi. Therefore, pcSi-on-$SiO_x$ contacts to Si wafers may provide a way to mitigate metallization degradation while enabling selective carrier extraction. This has resulted in very high efficiency cells that are process-temperature tolerant.

Traditionally, pcSi has been deposited using Low Pressure or Atmospheric Pressure Chemical Vapor Deposition (LP-, AP-CVD) at temperatures over 550° C. However, this results in double sided deposition or a wrap-around problem. Single-side approaches offer the flexibility of additive processes, without the need for film removal.

SUMMARY

The present disclosure provides methods for hydrogenation of passivated contacts.

In one example a method includes applying, to a passivated contact, a layer of a material. The material may contain hydrogen impurities. The method also includes subsequently annealing the material, and subsequently removing the material.

BRIEF DESCRIPTION OF THE DRAWINGS

FIGS. 3A and 3B are graphical plots illustrating secondary ion mass spectrometry (SIMS) data of a pcSi-on-$SiO_x$ passivated contact formed on crystalline silicon (cSi) and annealed for 30 minutes at 850° C., for B in p/pcSi and phosphorus (P) in n/pcSi, respectively.

FIGS. 5A and 5B are graphical plots illustrating SIMS data of a pcSi-on-$SiO_x$ passivated contact formed on cSi and annealed for 30 minutes at 850° C., for hydrogen and B in p/pcSi and hydrogen and P in n/pcSi, respectively.

DETAILED DESCRIPTION

Figure 1B:
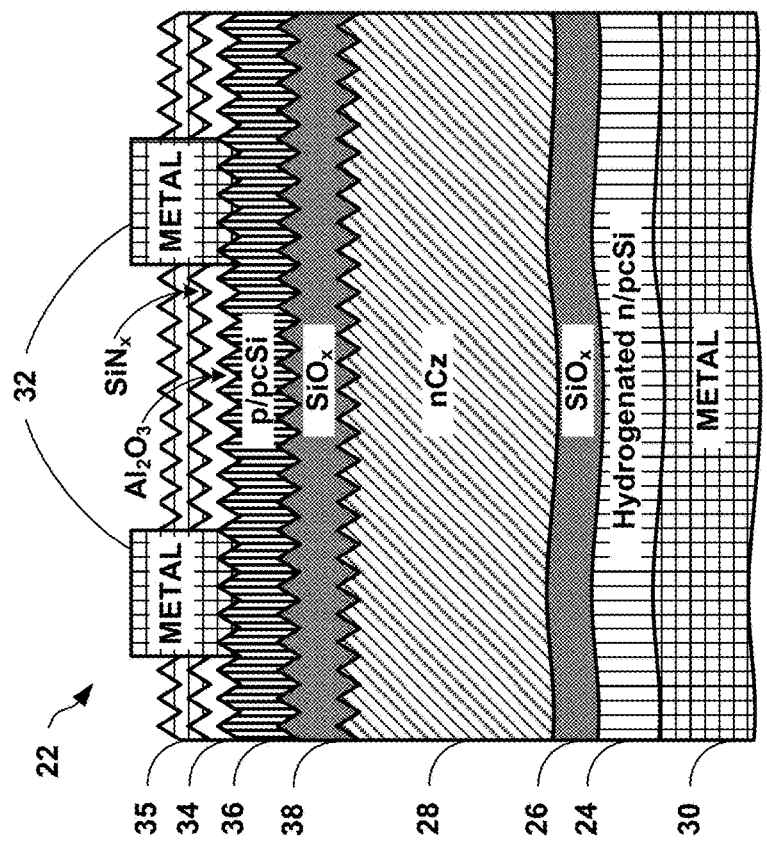
FIGS. 1A and 1B illustrate example cell structures that have an n-type polycrystalline silicon (n/pcSi)-on-$SiO_x$ passivated contact back surface field (BSF) coupled with a thermally diffused boron (B)-emitter, and a p-type polycrystalline silicon (p/pcSi)-on-$SiO_x$ passivated contact emitter, respectively.

Exemplary embodiments of the present invention provide a method for persistent hydrogenation of passivated contacts using materials having hydrogen impurities, such as aluminum oxide ($Al_2O_3$). For instance, aluminum oxide thin films can be used to passivate silicon surfaces, and can be grown using a number of processes including Plasma-Enhanced Chemical Vapor Deposition (PECVD) and/or Atomic Layer Deposition (ALD). The deposited film may be amorphous in nature. A subsequent anneal may crystallize and densify the deposited film. Such an anneal may have the added benefit of capping the underlying material and releasing hydrogen, as well as forming a negative fixed charge, which may be appropriate for p-type surfaces. The released hydrogen may further passivate the underlying materials, and may also make devices more resistant to damage from metallization and/or radiation.

When utilizing the capping and hydrogenation techniques described herein on passivated pcSi contacts grown on a thin tunneling oxide, further passivation of interfaces and defects may occur. Photoluminescence (PL) photography and lifetime data shows an improvement in passivation before and after $Al_2O_3$ hydrogenation of pcSi as described herein.

As one example, n- and p-type pcSi films may be applied on tunneling silicon oxide ($SiO_x$) to form passivated contacts to Si wafers. The resulting induced emitter and high/low (n+–n) back surface field junctions of high carrier selectivity and low contact resistivity may provide high efficiency Si solar cells. The tunneling $SiO_x$ layers (e.g., <10 nm, <2 nm, or another thickness) may be grown by any suitable method, such as thermal methods or chemical methods. The $SiO_x$ layer growth may be followed by a PECVD growth of p+ or n+-doped a-Si:H. The doped a-Si:H may be thermally crystallized into pcSi, which may result in grain nucleation and growth, dopant diffusion into the tunneling oxide and the Si base wafer, and/or interface restructuring. The cell process may improve the passivation of both oxide interfaces and tunneling transport through the oxide.

In accordance with the techniques described herein, the passivated contact and/or the whole cell may be coated with $Al_2O_3$ grown using ALD, which may then be activated at 400° C. Such additional passivation may persist after subsequent chemical removal of the $Al_2O_3$. The present disclosure provides various details of the method and addresses aspects of the performance of Si solar cells treated by this method, which may be governed by the properties of the individual layers (pcSi, tunneling oxide) and by the process history of the cell as a whole.

By carefully tailoring the cell process steps, the techniques described herein may avoid bulk defects, secondary phases, and/or oxide breakdown, while maintaining or improving interface stability, passivation, and/or carrier selective transport. Furthermore, the present disclosure may provide improved Si cell wafer surface morphology (e.g., without micropyramids) and post-deposited a-Si:H capping layers to pcSi to reduce or negate the significant challenges presented by passivated contact metallization due to metal diffusion and damage induced by deposition.

While described herein within the context of solar cells, one or more techniques of the present disclosure may additionally or alternatively be used in various other contexts. For example, using a material containing hydrogen impurities may be used as a hydrogenation source in various structures, including thin Si (both kurfless wafers as well as grown thin Si). As another example, the techniques described herein may, in some instances, serve as a replacement for $SiN_x$ hydrogenation processes. The techniques described herein may also be useful in the production of integrated circuits, thin film transistor displays, and other electronic devices.

Figure 1A:
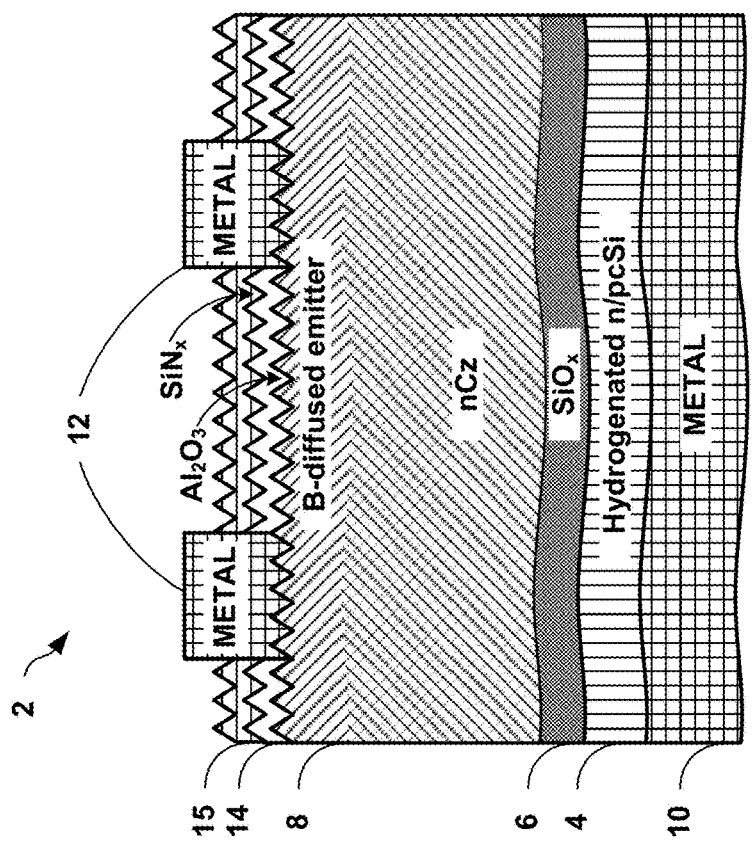

FIGS. 1A and 1B show example cell structures created in accordance with one or more techniques of the present disclosure. FIG. 1A shows an example solar cell structure (e.g., solar cell 2) that includes a hydrogenated passivated contact back surface field (BSF) made up of hydrogenated n/pcSi layer 4 on $SiO_x$ layer 6. The BSF of solar cell 2 is coupled with thermally diffused B-emitter layer 8.

Layer 8, in the example of FIG. 1A, is a monocrystalline silicon wafer (e.g., formed using the Czochralski process) into which a dopant, such as B, has been diffused using a thermal method or another method. Layer 6 may be applied on the back of layer 8 using any suitable process (e.g., a chemical process, a thermal process, or another process). Thereafter, a layer of pcSi (e.g., n/pcSi) may be applied on layer 6. For instance, the layer of pcSi may be grown using PECVD. This pcSi on $SiO_x$ stack may serve as a passivated contact to the solar cell (e.g., to which metalized connections could be attached).

In accordance with the techniques described herein, a layer of material containing hydrogen impurities (e.g., $Al_2O_3$) may be applied over the passivated contact. This process is further described below with respect to FIG. 2. In some examples, the layer of material may be applied to both the top and bottom of the device, thereby covering the bottom surface of the pcSi layer and the top of the layer 8. In the example of FIG. 1A, a layer of $Al_2O_3$ was applied to both the top of the device, forming layer 14, and the bottom of the device (not shown). The material layer or layers (and other layers) may be annealed. Annealing the material layer(s) may cause the hydrogen impurities of the material to diffuse into the pcSi layer and/or layer 8. That is, annealing the material may hydrogenate the pcSi, thereby forming layer 4 as shown in FIG. 1A.

After annealing, the material layer may be removed. In some examples, the material layer may be removed from the entire device. For instance, the material layer may be removed from the bottom of layer 4 and the top of layer 8. In other examples, the material may be left on the top of layer 8 but removed from the bottom of layer 4. In the example of FIG. 1A, for instance, layer 14 remains above layer 8 while the material layer has been removed from the bottom of layer 4.

As shown in the example of FIG. 1A, $SiN_x$ layer 15 may be applied on top of layer 14 to create a front contact for solar cell 2. The back contact may be covered with metal layer 10. Similarly, a metallization process may be performed on at least a portion of the front contact to form layer 12. Layers 10 and 12 may collect the charges created by solar cell 2. As shown in the example of FIG. 1A, solar cell 2 utilizes a "hybrid" architecture wherein the cell's BSF is a full-area passivated contact, and the front is a ~130Ω/☐ thermally diffused B emitter that is passivated by an $Al_2O_3$/$SiN_x$ stack (e.g., layers 14 and 15).

FIG. 1B shows another example solar cell structure (solar cell 22) that has a hydrogenated passivated BSF made up of hydrogenated n/pcSi layer 24 on $SiO_x$ layer 26. The BSF of solar cell 22 is coupled with a passivated contact emitter made up of p/pcSi layer 36 on $SiO_x$ layer 38. Solar cell 22, as shown in the example of FIG. 1B, uses tunneling passivated contact structures both as an emitter and a BSF.

Figure 2:
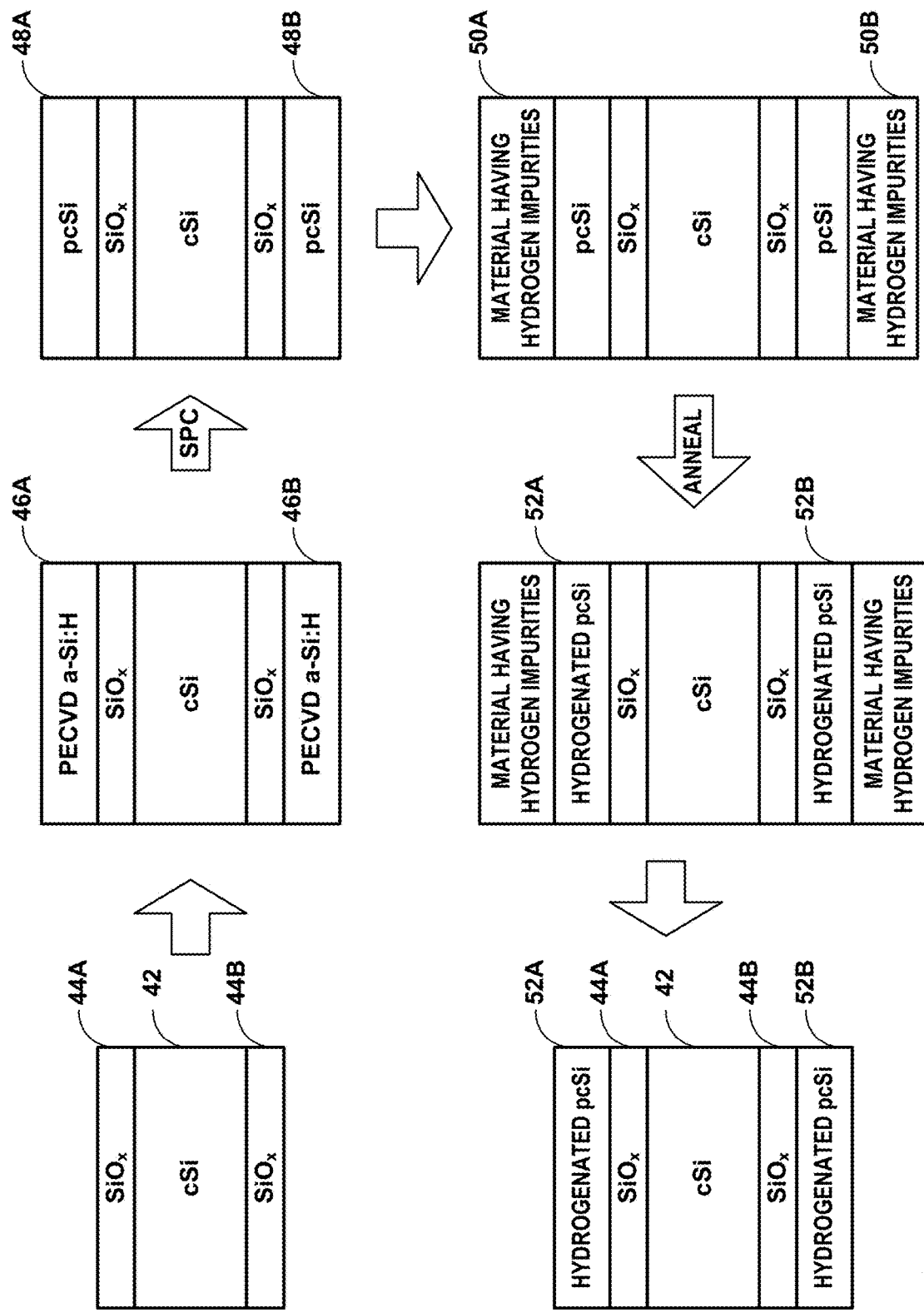
FIG. 2 is a flow diagram illustrating growth and solid phase crystallization (SPC) of a pcSi-on-$SiO_x$ passivated contact.

FIG. 2 is a flow diagram showing growth and solid phase crystallization (SPC) of a pcSi-on-SiOx passivated contact. FIG. 2 illustrates a low-temperature, single-sided PECVD route to deposit doped a-Si:H on tunneling $SiO_x$, which is then annealed to form pcSi-on-$SiO_x$ passivated contact stacks. The present disclosure also describes the effect of the individual layer properties (tunneling oxide and pcSi) on performance of the passivated contacts, and their interaction during the cell process. Furthermore, the present disclosure addresses the mechanisms responsible for the observed contact degradation by their metallization, and demonstrates ways to minimize such contact degradation.

The example of FIG. 2 may begin with a cSi wafer (e.g., wafer 42). As specific examples, wafer 42 may be a Norsun (4 Ω-cm) n-Cz textured (TXT) and potassium hydroxide (KOH) saw damage removed (SDR) wafer, a Topsil (2 Ω-cm) pFZ double-side polished (CMP), an intrinsic wafer, or another type of wafer. In some examples, wafer 42 may be RCA cleaned. Wafer 42 may be subjected to thin (~1.5 nm) growth of $SiO_x$ (e.g., layers 44A and 44B). As one specific example, layers 44A and 44B may be grown chemically using room temperature $HNO_3$ (RTNAOS) or thermally (LTO) in a tube furnace.

Heavily doped amorphous silicon (a-Si:H) (e.g., layers 46A and 46B) may be deposited on both sides of the wafer to produce a symmetric structure. As one specific example, layers 46A and 46B may be deposited using PECVD at low temperature (<350° C.) using $SiH_4$, $H_2$, and $B_2H_6$ or $PH_3$ dopant gases. During testing, the a-Si:H was also deposited on a single side on quartz witness slides for reference.

The a-Si:H may be thermally solid phase crystallized (SPC) into pcSi (e.g., layers 48A and 48B). As one specific example, layers 48A and 48B may be formed in a tube furnace with $N_2$ flow at 850° C. for various times, then subjected to a forming gas anneal (FGA) at 450° C. In accordance with the techniques described herein, the resulting passivated contacts may be cleaned and further passivated with, e.g., an $Al_2O_3$ film grown using ALD in a Beneq reactor as further described below.

Lifetime measurements of devices created in accordance with the techniques described herein were made using a Sinton WCT-120 Lifetime tester in Generalized (1/1) mode at high-level injection. Transport measurements were made using Transmission Line Method (TLM) patterns with 1 µm thick evaporated Al pads, while Hall measurements were made on quartz witness samples with In dots. Photoluminescence was performed using an 810 nm laser diode source and Si CCD camera with a user defined exposure time. Thickness measurements used an n&k Analyzer, while scanning electron microscope (SEM) images were acquired using a FEI Quanta 600. Secondary ion mass spectrometry (SIMS) depth profiles were measured using 1.5 keV ion bombardment energy from an $O_2$ source.

In some examples, the character of the initial tunnel $SiO_x$ layer may substantially influence the passivation and electronic performance of the pcSi-on-$SiO_x$ stack due to density and stoichiometry deviations. High temperature, thermal $SiO_x$ is dense and close to $SiO_2$ stoichiometry, is limited in bulk defects, and may provide excellent wafer surface chemical passivation. Subsequent hydrogen treatments (e.g., using FGA, alneal, or secondary film (such as $SiN_x$) anneals) may passivate the residual bulk and interfacial dangling bonds. Chemically-grown $SiO_x$ layers may be less dense and off-stoichiometric, and may result in inferior passivation.

Subjecting the a-Si:H-on-$SiO_x$ stack to a high temperature annealing step may densify or break up the $SiO_x$ layer depending on its pre-existing condition, as well as the heating rate and peak temperature. Such a crystallization anneal effuses hydrogen, nucleates and grows pcSi material, and redistributes dopants.

In some examples, the passivated contacts (e.g., the pcSi on $SiO_x$ stacks) may be further passivated using the persistent hydrogenation techniques described herein. For instance, a layer of material having hydrogen impurities (e.g., layers 50A and 50B) may be applied over one or more of the passivated contacts. As one specific example of a material having hydrogen impurities, layers 50A and 50B may be $Al_2O_3$.

The device may thereafter be annealed, causing hydrogen from layer 50A and layer 50B to diffuse into the respective adjacent pcSi layer. As a result, layers 48A and 48B may become hydrogenated pcSi layers (e.g., layers 52A and 52B). The hydrogenation of layers 52A and 52B may remain even after removal of the material having hydrogen impurities. In the example of FIG. 2, for instance, layers 50A and 50B may be removed from layers 52A and 52B, respectively, using any acceptable process. In some examples, the material containing hydrogen impurities may not be removed from one or both sides. That is, in some examples, layer 50A and/or layer 50B may not be removed.

FIGS. 3A and 3B are graphical plots illustrating SIMS data of a pcSi-on-$SiO_x$ passivated contact formed on cSi and annealed for 30 minutes at 850° C., for B in p/pcSi and P in n/pcSi, respectively. The SIMS data shown in FIGS. 3A and 3B were taken in a low-energy regime to minimize collisional mixing manifested by exaggerated elemental drive-in. Both the p/pcSi and the n/pcSi crystallization time series shown respectively in FIGS. 3A and 3B show increased shallow emitter formation by diffusion through the $SiO_x$ layer into the wafer with increasing time. Dopant pile-up at the pcSi/$SiO_x$ interface and/or the $SiO_x$/cSi interface is found for both dopant types as well. This so-called snowplow effect has been measured at interfaces with and without a $SiO_x$ interlayer and even when monolayer delta doping growths have been implemented. The snowplow effect may be associated with chemical passivation of interfacial dangling bonds by dopant atoms.

Tables I and II show sheet resistivities ($\rho_{sheet}$) and dopant concentrations of both p/pcSi and n/pcSi witness films on quartz via Hall measurements, contrasted with TLM results of the same films on pFZ and nCz wafers. The TLM measurements show an increase in $\rho_{sheet}$ with anneal time. This increase may be due to increased shallow emitter formation in the wafer. The Hall measurements resulted in $1–3\times10^{20}$ active dopants (both P and B) for pcSi films on quartz, with an increase in active P and a decrease in active B with anneal time.

TABLE I p/pcSi passivated contact TLM $\rho_{sheet}$ measurements on various substrates and dopant concentration

| 850° C. Anneal Time (min) | Quartz (Ω/□) | Quartz Active Boron Concentration ($\times 10^{20}$/cm$^3$) | nCz/LTO/ TXT (Ω/□) | pFZ/CMP/ LTO (Ω/□) |
|---|---|---|---|---|
| 5 | 1608 | 2.94 | 1884 | 61 |
| 30 | 2621 | 1.50 | 1122 | 59 |
| 90 | 3009 | 1.20 | 638 | 53 |

TABLE II n/pcSi passivated contact TLM $\rho_{sheet}$ measurements on various substrates and dopant concentration

| 850° C. Anneal Time (min) | Quartz (Ω/□) | Quartz Active Phosphorus Concentration ($\times 10^{20}$/cm$^3$) | nCz/SDR/LTO (Ω/□) |
|---|---|---|---|
| 5 | 2429 | 1.20 | 171 |
| 30 | 792 | 2.94 | 137 |
| 90 | 736 | 3.00 | 101 |

Figure 4:
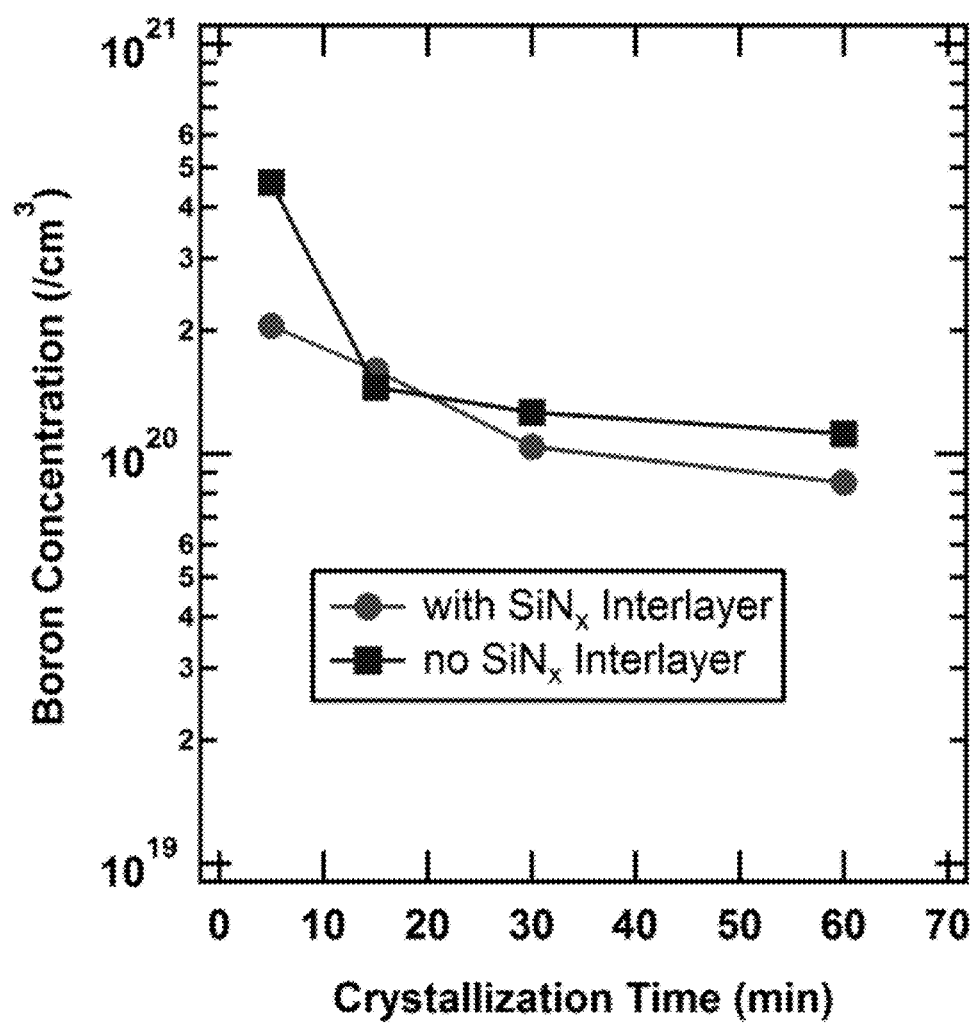
FIG. 4 is a graphical plot illustrating decreasing active B concentration with crystallization time on p/pcSi-on-$SiO_x$, with and without a silicon nitride (SiN) interlayer.

The deactivation of B reflected in Table I above may be explained by diffusion into the quartz, secondary crystalline phase formation, and/or complexing in the bulk via amorphous clustering. As shown in the example of FIG. 4, deactivation may also occur when similar anneal time comparison is performed on quartz samples with and without a $SiN_x$ B-diffusion barrier. Secondary phase formation or complexing may be in the bulk of the p/pcSi or in the pile-up region during the anneal and crystallization. Hall measurements on quartz indicate active dopant concentrations at least an order of magnitude lower than the total concentration measured by SIMS. P-type films have an exceedingly high amount of B, and once the solubility limit of B in Si is reached and a second phase ($SiB_x$) is formed, the B diffusivity may be degraded. Since dopants will be segregated, the $SiB_x$ may form at grain boundaries and interfaces.

In accordance with the techniques described herein, after crystallization, the passivated contact stack and/or other surfaces may be further passivated by reintroducing atomic hydrogen using FGA- and/or ALD-grown $Al_2O_3$ deposition and activation. In some examples, $SiN_x$ or remote H plasma may produce a similar effect. Table III shows passivation data from two concrete examples using single side polished (SSP) n/pcSi-on-$SiO_x$ symmetric stacks on SSP wafer pieces (Montco n-Cz, 5.6 Ω-cm). Subsequent $SiN_x$/FGA and $Al_2O_3/N_2$ anneal treatments were performed, resulting in similar implied open-circuit voltage (iVoc) values. When $Al_2O_3$ or another suitable material having hydrogen impurities is deposited using ALD, this passivation may be maintained even after the $Al_2O_3$ or other material is removed (e.g., by an HF dip). Thus, the $Al_2O_3$ or other material may be used as a hydrogen reservoir that passivates interfaces, grain boundaries, $SiO_x$ dangling bonds, and/or the wafer/$SiO_x$ interface.

FIGS. 5A and 5B are graphical plots illustrating SIMS data of a pcSi-on-$SiO_x$ passivated contact formed on cSi and annealed for 30 minutes at 850° C., for hydrogen and B in p/pcSi and hydrogen and P in n/pcSi, respectively. It can be seen in FIGS. 5A and 5B that after HF removal of $Al_2O_3$ on passivated contact stacks, hydrogen tends to track with the B profile especially at the pile-up location, indicating chemical passivation of the pcSi/$SiO_x$ and $SiO_x$/cSi interfaces, bulk pcSi grain boundaries, and possible additional crystallographic defects, but does not follow the pile-up region for the P profile.

TABLE III

Hydrogenation of n/pcSi-on-$SiO_x$ passivated contact with $SiN_x$ and $Al_2O_3$ (with subsequent HF removal)

| Sample | Crystallization iVoc (mV) | FGA iVoc (mV) | SiNx As Grown iVoc (mV) | SiNx + FGA iVoc (mV) |
|---|---|---|---|---|
| 1 | 656 | 685 | 677 | 696 |

| | Crystallization iVoc (mV) | FGA iVoc (mV) | Al2O3 + Anneal iVoc (mV) | HF Dip iVoc (mV) |
|---|---|---|---|---|
| 2 | 620 | 660 | 698 | 697 |

Figures 6A, 6B:
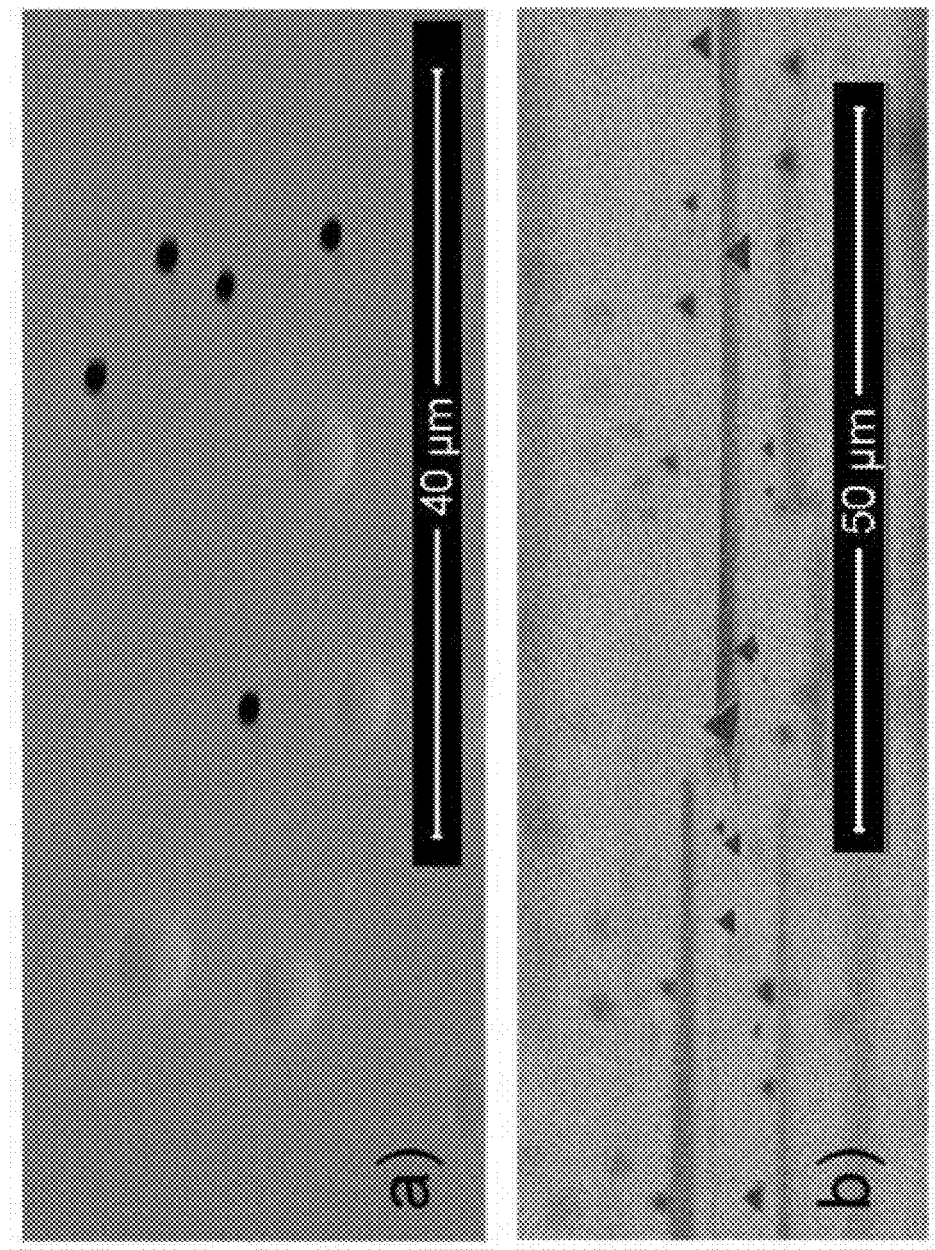
FIGS. 6A and 6B are scanning electron microscope (SEM) images illustrating blistering in a p/pcSi-on-$SiO_x$ film stack formed on cSi, and residual wafer surface microtips after planarization by concentrated potassium hydroxide (KOH), respectively.

FIGS. 6A and 6B are scanning electron microscope (SEM) images illustrating blistering in a p/pcSi-on-$SiO_x$ film stack formed on cSi, and residual wafer surface microtips after planarization by concentrated potassium hydroxide (KOH), respectively. In some examples, metallization can degrade passivated contact performance based on deposition technique and/or existence of blisters, pinholes, or other metal diffusion paths. Blistering of films, as seen in FIG. 6A, can occur at either side of the $SiO_x$ interface during deposition or crystallization if conditions are not carefully optimized. A further complication in depositing doped a-Si:H precursor films is that B-doped films may effuse hydrogen at lower temperatures than P-doped films, so extra care should be implemented during deposition and when annealing. Surface preparation is another factor in the ultimate performance of the passivated contact. For instance, microtip features on SDR surfaces, as shown in FIG. 6B, may coincide with lifetime degradation. Such microtip features can occur from incomplete KOH etching.

Figure 7A:
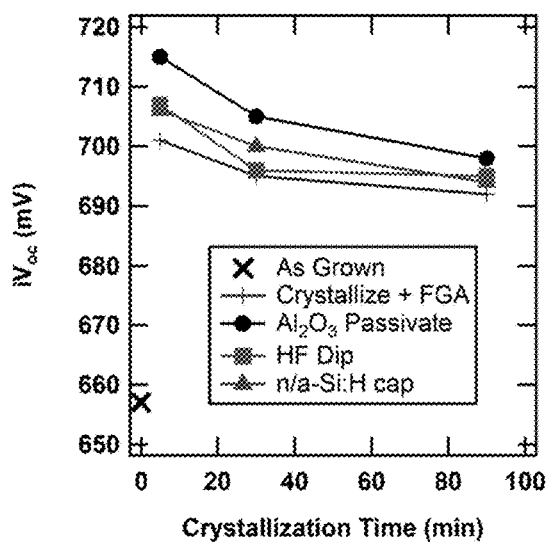
FIGS. 7A and 7B are graphical plots illustrating lifetime measurements of nitrogen-doped Czochralski (nCz) saw damage removed (SDR) silicon wafers that have an n/pcSi-on-$SiO_x$ stack grown thereon.
Figure 7B:
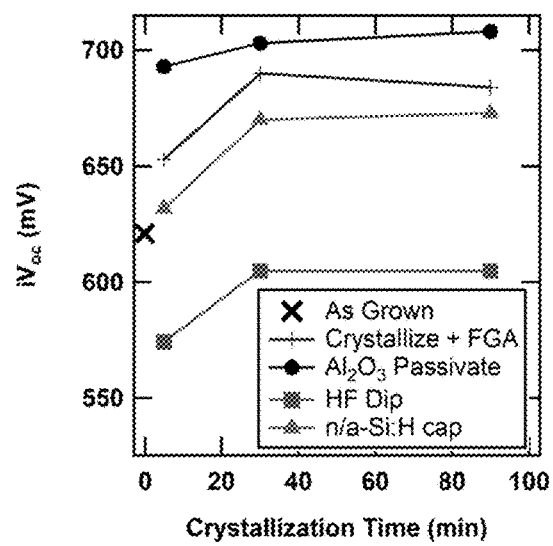
Figure 7C:
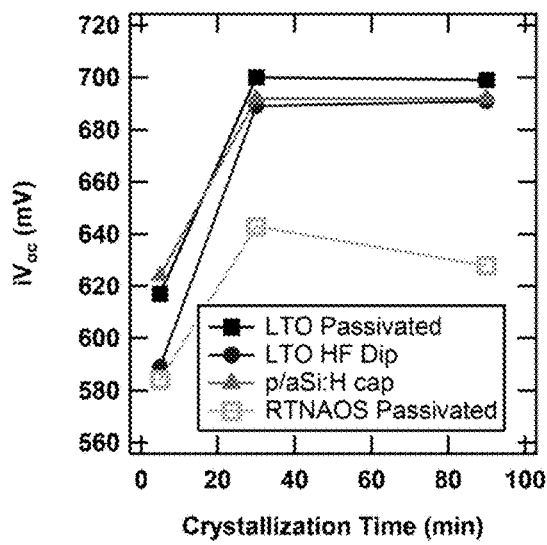
FIG. 7C is a graphical plot illustrating lifetime measurements of preferred float zone (pFZ) chemical-mechanical planarized (CMP) silicon wafers, having a p/pcSi on thermal $SiO_x$ stack grown thereon, compared with passivated p/pcSi on chemical $SiO_x$.
Figure 7D:
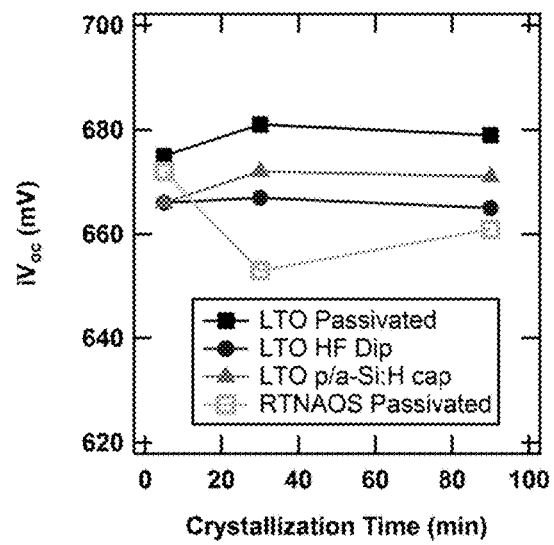
FIG. 7D is a graphical plot illustrating lifetime measurements of nCz textured (TXT) silicon wafers, having p/pcSi on thermal $SiO_x$ grown thereon, compared with passivated p/pcSi on chemical $SiO_x$.

In some examples, in order to mitigate deleterious metallization effects, a thin doped a-Si:H cap may be applied on passivated contacts (e.g., after further passivation with, and removal of, $Al_2O_3$). FIGS. 7A and 7B show the results of lifetime measurements performed on n/pcSi films grown on LTO (thermal) and RTNAOS (chemical) $SiO_x$ on nCz SDR wafers, respectively. FIGS. 7C and 7D compare p/pcSi grown on both thermal and chemical $SiO_x$ on CMP (polished) pFZ and TXT nCz wafers, respectively. The samples (referenced to the as-grown, initial a-Si:H-on-$SiO_x$ stack) are crystallized and FGA, passivated with $Al_2O_3$, stripped with HF, and finally capped with the intermediate a-Si:H layer. An increase in passivation is seen once the $Al_2O_3$ treatment is performed for all samples in FIGS. 7A-7D. A slight drop (10 mV) may occur when $Al_2O_3$ is removed by HF on samples employing a thermal $SiO_x$ or a chemical $SiO_x$ sample. The a-Si:H cap heals this to some degree, but a sustained degradation may be present.

Figure 8:
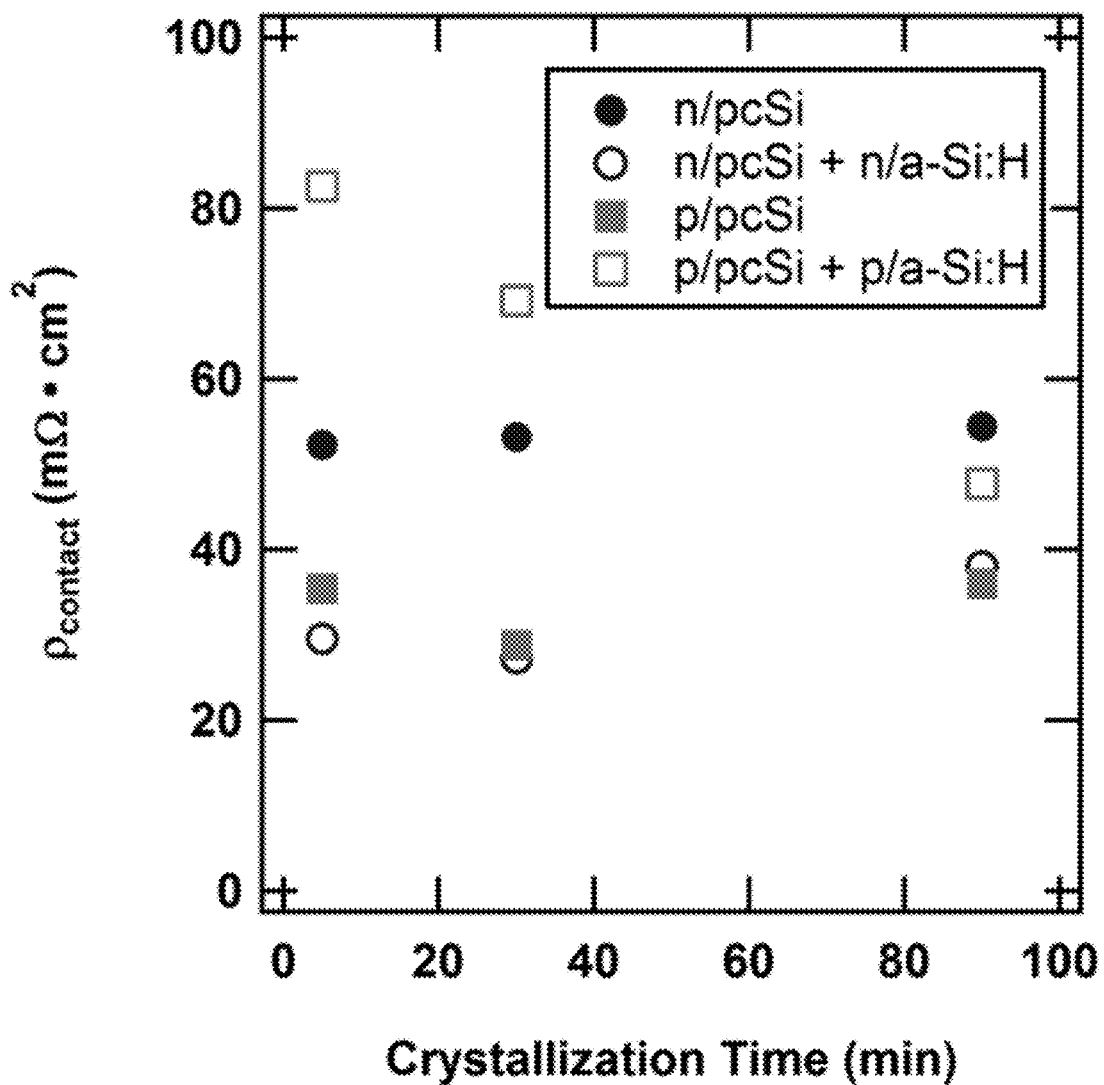
FIG. 8 is a graphical plot illustrating contact resistance measurements of pcSi on low temperature oxide (LTO) $SiO_x$ passivated contacts with and without a-Si:H interlayers.

FIG. 8 is a graphical plot illustrating contact resistance measurements of pcSi on LTO $SiO_x$ passivated contacts with and without a-Si:H interlayers. Contact resistance TLM measurements with Al pads were made using high/low junctions using n/pcSi passivated contacts to nCz (~2 Ω-cm) wafers and p/pcSi to pFZ (~4 Ω-cm) wafers. Additional, appropriately doped, thin (~5 nm) a-Si:H films were deposited to determine changes in transport behavior. All stacks show a contact resistance of <100 mΩ/cm², which is acceptable for a full area contact in 1-sun Si solar cells. Furthermore, a-Si:H doping and film thickness can be tailored to improve performance.

Figure 9:
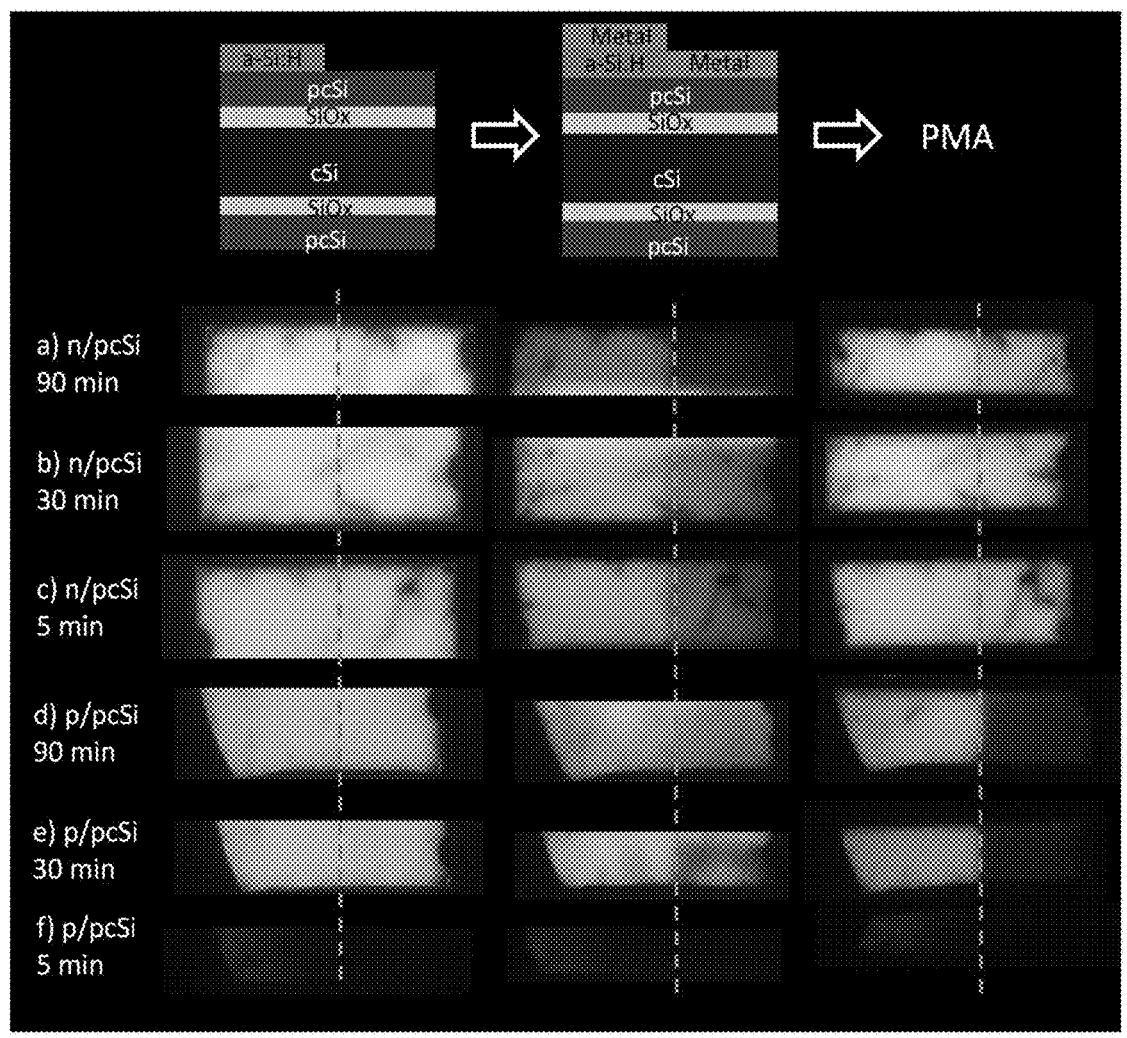
FIG. 9 is a set of photoluminescence (PL) images illustrating p/pcSi-on-$SiO_x$ and n/pcSi-on-$SiO_x$ stacks with half samples capped with a-Si:H, metallized with Al and subjected to a post-metallization anneal (PMA).

FIG. 9 is a set of PL images illustrating p/pcSi-on-$SiO_x$ and n/pcSi-on-$SiO_x$ stacks with half samples capped with a-Si:H, metallized with Al and subjected to a PMA. PMAs are typically applied to mitigate e-beam, X-ray, or sputtering deposition damage. The PL images in FIG. 9 (normalized with the same exposure time) show the crystallization time series samples half capped with (~5 nm) doped a-Si:H to determine any further degradation in lifetime due to metallization. It can be seen that the 5 minute, 850° C. p/pcSi sample (f) is dark throughout due to severe blistering, caused by incomplete crystallization coupled with $Al_2O_3$ application. The more crystalline p/pcSi samples (d) and (e) show more metal degradation on regions without a capping layer, which is amplified by PMA. Conversely, the n/pcSi samples (a), (b), and (c) show initial degradation due to metallization that is somewhat healed by PMA.

Figures 10A, 10B:
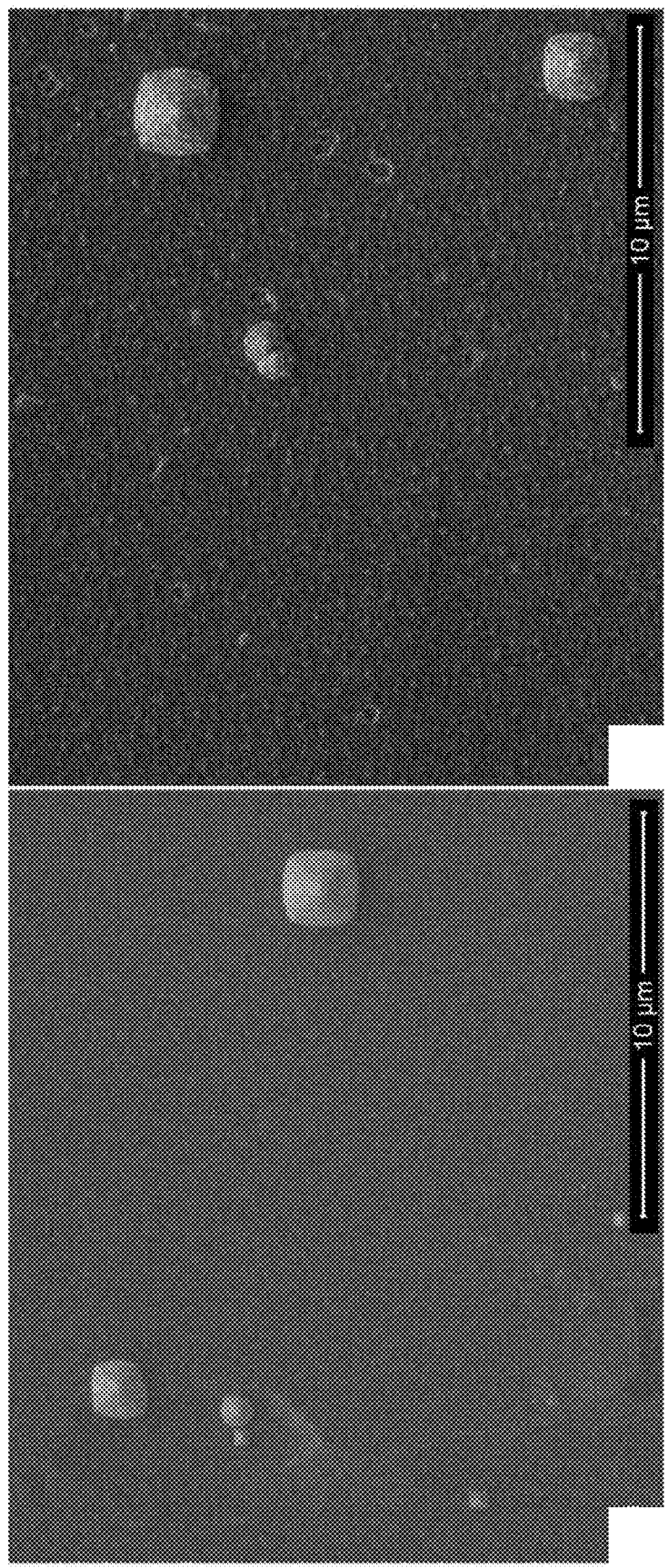
FIGS. 10A and 10B are SEM images illustrating an n/pcSi passivated contact on LTO (thermal) $SiO_x$ and on room temperature nitric acid oxidation of silicon (RTNAOS) (chemical) $SiO_x$, respectively.

FIGS. 10A and 10B are SEM images illustrating n/pcSi passivated contact on LTO (thermal) $SiO_x$ and on RTNAOS (chemical) $SiO_x$, respectively. Blistering and film roughness, as shown in FIGS. 10A and 10B, can account for the significant difference in lifetime from the results shown in FIGS. 7A-7D employing thermal versus chemical $SiO_x$. The $Al_2O_3$ passivates and hydrogenates both stacks, even with the presence of residual microtips and the exposed wafer surface regions where delamination has occurred. Upon $Al_2O_3$ removal, passivation maintains for the smooth, non-blistered stack using the thermal $SiO_x$ as shown in FIG. 10A. However, degradation may occur in the exposed wafer surfaces as shown in FIG. 10B, where delamination exists for the chemical $SiO_x$.

Another mechanism for poor performance is oxide break-up, which can result in solid phase epitaxy of the pcSi extending from the wafer surface, and upon metallization, can then be perceived as direct metal contact to the wafer. Depending on the degree of dopant segregation, the bulk of the epitaxial regions can range from highly doped regions with enhanced Auger recombination but relative immunity to metal contact, to severe dopant segregation into grain boundaries leaving lowly doped epitaxial columns with enhanced recombination when directly contacted to metal. Thus, the $SiO_x$ interlayer serves an important role in passivation, and continuity of the $SiO_x$ interlayer, as well as the continuity of the pcSi layer, should be maintained.

Exemplary embodiments of the present invention provide single side deposited pcSi on tunneling $SiO_x$ as effective passivated contacts to crystal silicon wafers, achieving over 700 mV iVoc for both n/pcSi to nCz and p/pcSi to pFZ wafers, with contact resistance below 100 m$\Omega$/cm$^2$. The initial $SiO_x$ character largely governs the eventual performance of the contact, where a denser, more stoichiometry oxide is desirable and is more resistant to defects such as blistering and delamination during deposition and in subsequent process steps. The pcSi may be crystallized from a PECVD-grown a-Si:H film. Gradually increasing depths of shallow emitter profiles were measured via SIMS and transport measurements with increasing anneal time. In accordance with the techniques described herein, hydrogenation of the passivated contact stack may be effectively achieved using $Al_2O_3$ thin films, which can then be removed, leaving passivation relatively unchanged. In some examples, metallization may produce damage and decrease passivation, both by inherent process externalities as well as by metal diffusion paths present in the pcSi-on-$SiO_x$ stack. The techniques described herein may effectively mitigate such metallization effects by utilizing a thin a-Si:H interlayer and/or annealing.

Figure 11:
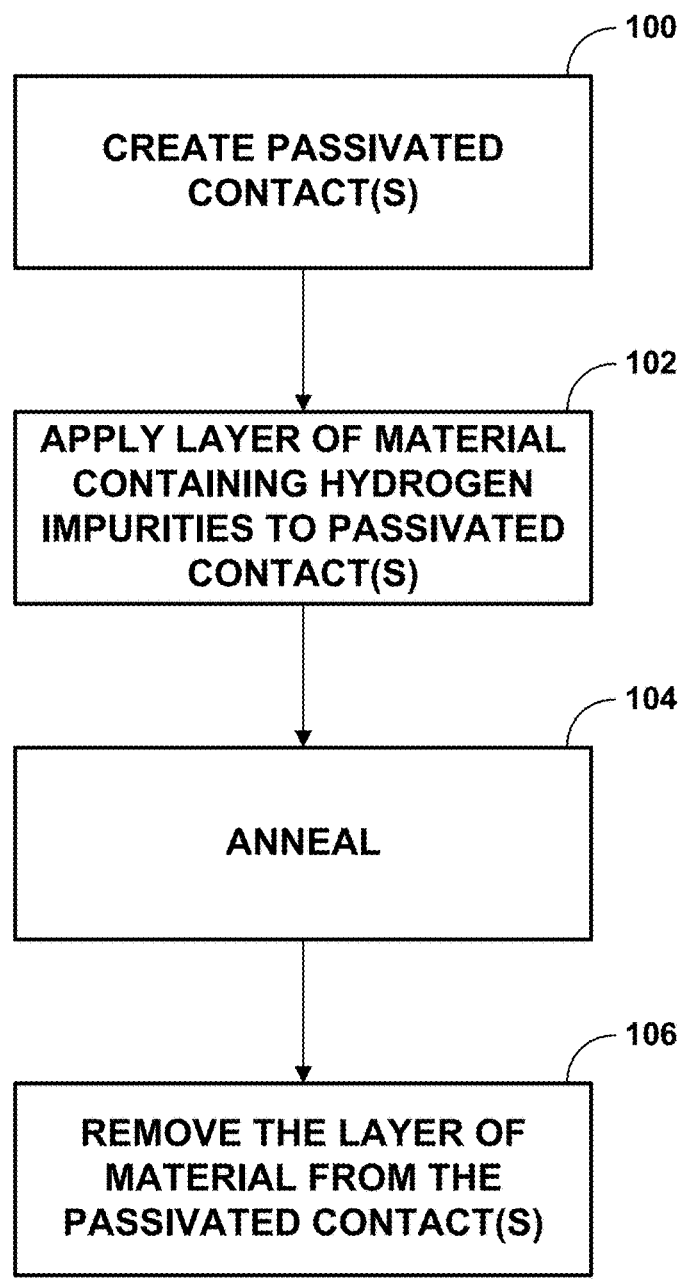
FIG. 11 is a flow diagram illustrating example operations for hydrogenation of passivated contacts, in accordance with one or more aspects of the present disclosure.

FIG. 11 is a flow diagram illustrating example operations for hydrogenation of passivated contacts, in accordance with one or more aspects of the present disclosure. The example operations of FIG. 11 may represent only a subset of the operations performed in hydrogenating passivated contacts, and various other operations may be additionally or alternatively included, as described herein.

In the example of FIG. 11, one or more passivated contacts may be created (100). The passivated contacts may be formed using any number of suitable methods, including PECVD, LP-CVD, Physical Vapor Deposition (e.g., e-beam or thermal), reactive sputtering, or others. The resulting passivated contacts may be made of various materials, such as pcSi, mixed-phase polycrystalline/amorphous silicon, pcSi alloys with carbon, oxygen and other atoms, and others. In some examples, the materials can be doped n- or p-type by various known dopant atoms (e.g., P, B, aluminum, arsenic, and other Group III and Group V elements).

A layer of material that contains hydrogen impurities may be applied to the passivated contact(s) (102). Examples of suitable materials that contain hydrogen impurities may include $Al_2O_3$, $SiO_2$, $SiN_x$, a-Si:H, as well as other material layers that incorporate hydrogen (e.g., up to several atomic percent) as a result of their specific growth method using H-containing radicals such as trimethylaluminum. The material may be applied using any suitable method, such as PECVD, LPCVD, ALD, dip-coat, spin-coat, and others.

After applying the material that contains the hydrogen impurities, the result may be annealed (104). Annealing may cause the hydrogen to diffuse from the applied material into the underlying passivated contact. The anneal may be performed with various parameters, including different temperatures, rates of temperature change, and durations. As a concrete example, the device may be heated to 400 degrees Centigrade over a period of 20 to 60 minutes.

In some examples, the applied layer of material may be removed from the passivated contacts (106). For example, the applied layer may be chemically removed using HF, or other suitable materials. In some examples, the applied layer may be removed in various other suitable ways, such as reactive ion etching, plasma etching, and others. Other methods may remove the applied layer by exploiting the layer's lower adhesion to the passivated contact. However, while the material may be removed, at least a portion of the improvements to the passivated contacts may remain. That is, the hydrogen diffusion resulting from the annealing may further passivate the contacts, and removal of the applied layer may not undo these improvements. As another example, a method may include applying, to a passivated contact, a layer of a material, the material containing hydrogen impurities; subsequently annealing the material; and subsequently removing the material from the passivated contact. In some examples, the material may be alumina ($Al_2O_3$). In some examples, the material may be applied using Plasma-Enhanced Chemical Vapor Deposition (PECVD). In some examples, the material may be applied using Atomic Layer Deposition (ALD). In some examples, the passivated contact may include a layer of polycrystalline silicon (pcSi) on silicon oxide (SiOx).

In some examples, the method may include growing the passivated contact on a silicon wafer, wherein growing the passivated contact comprises growing a layer of silicon oxide (SiOx) on the silicon wafer. In some examples, the layer of silicon oxide may have a thickness of 10 nm or less. In some examples, the layer of silicon oxide may have a thickness of 2 nm or less. In some examples, the layer of silicon oxide may be thermally grown on the silicon wafer. In some examples, the layer of silicon oxide may be chemically grown on the silicon wafer.

In some examples, growing the passivated contact may include growing amorphous silicon on the layer of silicon oxide. In some examples, growing the passivated contact may include thermally crystallizing the amorphous silicon to form a layer of polycrystalline silicon (pcSi). In some examples, the amorphous silicon may be applied using Plasma-Enhanced Chemical Vapor Deposition (PECVD).

In some examples, removing the material may include applying at least one of an acid or a base to the material. In some examples, the method may include applying a doped amorphous silicon cap on the passivated contact after removing the material. In some examples, the doped amorphous silicon cap may have a thickness between about 3 nm and about 7 nm. In some examples, the passivated contact may be incorporated within a solar cell.

The foregoing disclosure includes a number of examples set forth merely as illustration and these examples are not intended to be limiting. Modifications of the disclosed examples incorporating the spirit and substance of the described methods and/or devices may occur to persons skilled in the art. These and other examples are within the scope of the following claims.

What is claimed is:

1. A method comprising:
applying, to a passivated contact, a layer of a material, the material containing hydrogen impurities;
subsequently annealing the layer of the material; and
subsequently removing the layer of the material from the passivated contact.

2. The method of claim 1, wherein the layer of the material comprises alumina (Al2O3).

3. The method of claim 1, wherein the layer of the material is applied using Plasma-Enhanced Chemical Vapor Deposition (PECVD).

4. The method of claim 1, wherein the layer of the material is applied using Atomic Layer Deposition (ALD).

5. The method of claim 1, wherein the passivated contact comprises a layer of polycrystalline silicon (pcSi) on silicon oxide (SiOx).

6. The method of claim 1, further comprising growing the passivated contact on a silicon wafer, wherein growing the passivated contact comprises growing a layer of silicon oxide (SiOx) on the silicon wafer.

7. The method of claim 6, wherein the layer of silicon oxide has a thickness of 10 nm or less.

8. The method of claim 7, wherein the layer of silicon oxide has a thickness of 2 nm or less.

9. The method of claim 6, wherein the layer of silicon oxide is thermally grown on the silicon wafer.

10. The method of claim 6, wherein the layer of silicon oxide is chemically grown on the silicon wafer.

11. The method of claim 6, wherein growing the passivated contact further comprises growing amorphous silicon on the layer of silicon oxide.

12. The method of claim 11, wherein growing the passivated contact further comprises thermally crystalizing the amorphous silicon to form a layer of polycrystalline silicon (pcSi).

13. The method of claim 11, wherein the amorphous silicon is applied using Plasma-Enhanced Chemical Vapor Deposition (PECVD).

14. The method of claim 1, wherein removing the layer of the material comprises applying at least one of an acid or a base to the layer of the material.

15. The method of claim 1, further comprising applying a doped amorphous silicon cap on the passivated contact after removing the layer of the material.

16. The method of claim 15, wherein the doped amorphous silicon cap has a thickness between about 3 nm and about 7 nm.

17. The method of claim 1, wherein the passivated contact is incorporated within a solar cell.

* * * * *